(12) United States Patent
Zhang et al.

(10) Patent No.: US 8,751,889 B2
(45) Date of Patent: Jun. 10, 2014

(54) SYSTEMS AND METHODS FOR MULTI-PASS ALTERNATE DECODING

(75) Inventors: Fan Zhang, Milpitas, CA (US); Shaohua Yang, San Jose, CA (US)

(73) Assignee: LSI Corporation, San Jose, CA (US)

( * ) Notice: Subject to any disclaimer, the term of this patent is extended or adjusted under 35 U.S.C. 154(b) by 172 days.

(21) Appl. No.: 13/362,409

(22) Filed: Jan. 31, 2012

(65) Prior Publication Data
US 2013/0198584 A1 Aug. 1, 2013

(51) Int. Cl.
*G06F 11/00* (2006.01)

(52) U.S. Cl.
USPC .......................... 714/746; 714/796; 714/751

(58) Field of Classification Search
USPC .......... 714/746, 704, 794, 796, 792, 751, 795
See application file for complete search history.

(56) References Cited

U.S. PATENT DOCUMENTS

| | | | |
|---|---|---|---|
| 4,805,174 A * | 2/1989 | Kubota et al. ................. | 714/794 |
| 5,278,703 A | 1/1994 | Rub et al. | |
| 5,278,846 A | 1/1994 | Okayama | |
| 5,317,472 A | 5/1994 | Schweitzer, III | |
| 5,325,402 A | 6/1994 | Ushirokawa | |
| 5,392,299 A | 2/1995 | Rhines | |
| 5,417,500 A | 5/1995 | Martinie | |
| 5,513,192 A | 4/1996 | Janku | |
| 5,523,903 A | 6/1996 | Hetzler | |
| 5,550,810 A | 8/1996 | Monogioudis et al. | |
| 5,550,870 A | 8/1996 | Blaker | |
| 5,612,964 A | 3/1997 | Haraszti | |
| 5,696,504 A * | 12/1997 | Oliveros ........................ | 341/26 |
| 5,710,784 A | 1/1998 | Kindred | |
| 5,717,706 A | 2/1998 | Ikeda | |
| 5,802,118 A | 9/1998 | Bliss | |
| 5,844,945 A | 12/1998 | Nam | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | Mccalissister | |
| 6,023,783 A | 2/2000 | Divsalar | |
| 6,029,264 A | 2/2000 | Kobayashi | |
| 6,065,149 A | 5/2000 | Yamanaka | |
| 6,097,764 A | 8/2000 | McCallister | |
| 6,145,110 A | 11/2000 | Khayrallah | |
| 6,216,249 B1 | 4/2001 | Bliss | |
| 6,216,251 B1 | 4/2001 | McGinn | |
| 6,266,795 B1 | 7/2001 | Wei | |
| 6,317,472 B1 | 11/2001 | Choi | |
| 6,351,832 B1 | 2/2002 | Wei | |
| 6,377,610 B1 | 4/2002 | Hagenauer | |
| 6,381,726 B1 | 4/2002 | Weng | |
| 6,473,878 B1 | 10/2002 | Wei | |
| 6,535,553 B1 | 3/2003 | Limberg et al. | |

(Continued)

OTHER PUBLICATIONS

Casado et al., Multiple-rate low-density parity-check codes with constant blocklength, IEEE Transations on communications, Jan. 2009, vol. 57, pp. 75-83.

(Continued)

*Primary Examiner* — Fritz Alphonse
(74) *Attorney, Agent, or Firm* — Hamilton DeSanctis & Cha

(57) ABSTRACT

Various embodiments of the present invention provide systems and methods for data processing. For example, data decoding systems are disclosed that include a data decoder circuit and a decode value modification circuit.

22 Claims, 9 Drawing Sheets

(56) References Cited

U.S. PATENT DOCUMENTS

| | | |
|---|---|---|
| 6,625,775 B1 | 9/2003 | Kim |
| 6,748,034 B2 | 6/2004 | Hattori |
| 6,757,862 B1 | 6/2004 | Marianetti, II |
| 6,785,863 B2 | 8/2004 | Blankenship |
| 6,810,502 B2 | 10/2004 | Eidson |
| 6,970,511 B1 | 11/2005 | Barnette |
| 6,986,098 B2 | 1/2006 | Poeppelman |
| 7,047,474 B2 | 5/2006 | Rhee |
| 7,058,873 B2 | 6/2006 | Song |
| 7,073,118 B2 | 7/2006 | Greenberg |
| 7,093,179 B2 | 8/2006 | Shea |
| 7,117,427 B2 | 10/2006 | Ophir |
| 7,133,228 B2 | 11/2006 | Fung |
| 7,184,486 B1 | 2/2007 | Wu |
| 7,191,378 B2 | 3/2007 | Eroz |
| 7,203,887 B2 | 4/2007 | Eroz |
| 7,308,061 B1 | 12/2007 | Huang |
| 7,310,768 B2 | 12/2007 | Eidson |
| 7,313,750 B1 | 12/2007 | Feng |
| 7,370,258 B2 | 5/2008 | Iancu |
| 7,415,651 B2 | 8/2008 | Argon |
| 7,502,189 B2 | 3/2009 | Sawaguchi |
| 7,523,375 B2 | 4/2009 | Spencer |
| 7,587,657 B2 | 9/2009 | Haratsch |
| 7,590,168 B2 | 9/2009 | Raghavan |
| 7,646,829 B2 | 1/2010 | Ashley |
| 7,702,986 B2 | 4/2010 | Bjerke |
| 7,752,523 B1 | 7/2010 | Chaichanavong |
| 7,779,325 B2 | 8/2010 | Song |
| 7,802,172 B2 | 9/2010 | Casado |
| 7,952,824 B2 | 5/2011 | Dziak |
| 7,958,425 B2 | 6/2011 | Chugg |
| 7,996,746 B2 | 8/2011 | Livshitz |
| 8,018,360 B2 | 9/2011 | Nayak |
| 8,201,051 B2 | 6/2012 | Tan |
| 8,237,597 B2 | 8/2012 | Liu |
| 8,261,171 B2 | 9/2012 | Annampedu |
| 8,291,284 B2 | 10/2012 | Savin |
| 8,295,001 B2 | 10/2012 | Liu |
| 2008/0069373 A1 | 3/2008 | Jiang |
| 2008/0304558 A1 | 12/2008 | Zhu et al. |
| 2009/0132893 A1 | 5/2009 | Miyazaki |
| 2009/0185643 A1 | 7/2009 | Fitzpatrick |
| 2011/0167227 A1 | 7/2011 | Yang |
| 2011/0264987 A1 | 10/2011 | Li |
| 2012/0124118 A1 | 5/2012 | Ivkovic |
| 2012/0182643 A1 | 7/2012 | Zhang |
| 2012/0207201 A1 | 8/2012 | Xia |
| 2012/0212849 A1 | 8/2012 | Xu |
| 2012/0262814 A1 | 10/2012 | Li |
| 2012/0265488 A1 | 10/2012 | Sun |

OTHER PUBLICATIONS

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF($2^\wedge$ m) LDPC Decoders", IEEE Transactions on Circuits and Systemsѕi: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/305,510, Unpublished, filed Nov. 28, 2011 (Lei Chen).

U.S. Appl. No. 13/284,767, Unpublished, filed Oct. 28, 2011 (Fan Zhang).

U.S. Appl. No. 13/269,832, Unpublished, filed Oct. 10, 2011 (Haitao Xia).

U.S. Appl. No. 13/227,544, Unpublished, filed Sep. 8, 2011 (Shaohua Yang).

U.S. Appl. No. 13/174,453, Unpublished, filed Jun. 30, 2011 (Johnson Yen).

U.S. Appl. No. 13/239,683, Unpublished, filed Sep. 22, 2011 (Changyou Xu).

U.S. Appl. No. 13/186,234, Unpublished, filed Jul. 19, 2011 (Haitao Xia).

U.S. Appl. No. 13/213,751, Unpublished, filed Aug. 19, 2011 (Fan Zhang).

U.S. Appl. No. 13/180,495, Unpublished, filed Jul. 11, 2011 (Chung-Li Wang).

U.S. Appl. No. 13/300,078, Unpublished, filed Nov. 18, 2011 (Chung-Li Wang).

U.S. Appl. No. 13/302,119, Unpublished, filed Nov. 22, 2011 (Lei Chen).

U.S. Appl. No. 13/283,549, Unpublished, filed Oct. 27, 2011 (Wu Chang).

U.S. Appl. No. 13/296,022, Unpublished, filed Nov. 14, 2011 (Victor Krachkovsky).

U.S. Appl. No. 13/295,150, Unpublished, filed Nov. 14, 2011 (Zongwang Li).

U.S. Appl. No. 13/305,551, Unpublished, filed Nov. 28, 2011 (Yang Han).

U.S. Appl. No. 13/316,858, Unpublished, filed Dec. 12, 2011 (Zongwang Li).

U.S. Appl. No. 13/227,416, Unpublished, filed Sep. 7, 2011 (Lei Chen).

U.S. Appl. No. 13/174,537, Unpublished, filed Jun. 30, 2011 (Anantha Raman Krishnan).

U.S. Appl. No. 13/269,852, Unpublished, filed Oct. 10, 2011 (Haitao Xia).

U.S. Appl. No. 13/340,951, Unpublished, filed Dec. 30, 2011 (Lei Chen).

(56) References Cited

OTHER PUBLICATIONS

U.S. Appl. No. 13/340,974, Unpublished, filed Dec. 30, 2011 (Dan Liu).
U.S. Appl. No. 13/316,741, Unpublished, filed Dec. 12, 2011 (Yang Han).
U.S. Appl. No. 13/171,615, Unpublished, filed Jun. 29, 2011 (Bradley D. Seago).
U.S. Appl. No. 13/113,219, Unpublished, filed May 23, 2011 (Yang Han).
U.S. Appl. No. 13/284,730, Unpublished, filed Oct. 28, 2011 (Fan Zhang).
U.S. Appl. No. 13/327,279, Unpublished, filed Dec. 15, 2011 (Wei Feng).
Vasic, B., "High-Rate Low-Density Parity-Check Codes Based on Anti-Pasch Affine Geometries," Proc ICC 2002, pp. 1332-1336.
Vasic, B., "High-Rate Girth-Eight Codes on Rectangular Integer Lattices", IEEE Trans. Communications, vol. 52, Aug. 2004, pp. 1248-1252.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. on Information Theory, vol. 57, No. 10 (Oct. 2011).
Zhong et al., "Joint Code-Encoder Design for LDPC Coding System VLSI Implementation", ISCAS, IEEE pp. 389-392, May 2004.
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong, "Block-LDPC: A Practical LDPC Coding System Design Approach", IEEE Trans. On Circuits, Regular Papers, vol. 5, No. 4, pp. 766-775, Apr. 2005.

\* cited by examiner

SYSTEMS AND METHODS FOR MULTI-PASS ALTERNATE DECODING

BACKGROUND OF THE INVENTION

The present inventions are related to systems and methods for data processing, and more particularly to systems and methods for data decoding.

Various storage systems include data processing circuitry implemented with a data decoding circuit. In some cases, a belief propagation based decoder circuit is used. In such cases where high rate low density parity check codes are used, an error floor is more severe because short cycles are unavoidable. Such short cycles make the messages in the belief propagation decoder correlate quickly and degrade the performance. In contrast, a maximum likelihood decoder may be used as it does not exhibit the same limitations. However, such maximum likelihood decoders are typically too complex for practical implementation.

Hence, for at least the aforementioned reasons, there exists a need in the art for advanced systems and methods for data processing.

BRIEF SUMMARY OF THE INVENTION

The present inventions are related to systems and methods for data processing, and more particularly to systems and methods for data decoding.

Various embodiments of the present invention provide data decoding systems that include: a data decoder circuit and a decode value modification circuit. The data decoder circuit is operable to: apply a data decode algorithm to a decoder input to yield a first decoded output and an indication of at least one point of failure of the first decoded output, apply the data decode algorithm to the decoder input guided by a first modified decode output to yield a second decoded output and an indication of at least one point of failure of the second decoded output, and apply the data decode algorithm to the decoder input guided by a second modified decode output to yield a third decoded output and an indication of at least one point of failure of the third decoded output. The decode value modification circuit is operable to: identify a first symbol of the first decoded output associated with the point of failure of the first decoded output, and to modify a subset of values associated with the identified symbol to yield the first modified decode output; and identify a second symbol of the second decoded output associated with the point of failure of the second decoded output, and to modify a subset of values associated with the identified first symbol and the identified second symbol to yield the second modified decode output. In some instances of the aforementioned embodiments, the data decoding system is implemented as part of a storage device or a receiving device. In various instances of the aforementioned embodiments, the data decoding system is implemented as part of an integrated circuit.

In some instances of the aforementioned embodiments, the data decode algorithm is a low density parity check algorithm, and the point of failure of the first decoded output is a failure of a parity check equation implemented as part of the low density parity check algorithm. In some such instances, the low density parity check algorithm is a non-binary low density parity check algorithm, and in other such instances the low density parity check algorithm is a binary low density parity check algorithm. In particular cases, the low density parity check algorithm is implemented as a belief propagation data decode algorithm.

In various instances of the aforementioned embodiments, the decode value modification circuit includes a partial maximum likelihood decode algorithm to identify the first symbol and the second symbol. In some such instances, the decode value modification circuit includes: a syndrome calculation circuit operable to calculate a syndrome based upon a number of symbols associated with the point of failure of the first decoded output; an array calculator circuit operable to calculate an array of possible hard decision values across the contributors to the point of failure of the first decoded output; and an index identifier circuit operable to determine a candidate from the array as the identified symbol. In particular cases, the decode value modification circuit includes further includes: a likely symbol value selector circuit operable to determine whether the subset of values associated with the identified symbol includes one log likelihood ratio value or two log likelihood ratio values.

In one or more instances of the aforementioned embodiments, the data decoder circuit further includes a multi-pass controller circuit operable to selectively control generation of the first modified decode output and the second modified decode output. In particular cases, the controller circuit enables generation of the first modified decode output when: a number of iterations of the data decoder circuit applying the data decode algorithm to the decoder input is greater than a first threshold value; a number of points of failure corresponding to the first decoded output is less than a second threshold value; and the number of points of failure corresponding to the first decoded output is the same as the number of points of failure corresponding to a previous decoded output.

Other embodiments of the present invention provide methods for data decoding that include: applying a data decode algorithm by a data decoder circuit to a decoder input to yield a first decoded output and an indication of at least one point of failure of the first decoded output; identifying at least a first symbol and a second symbol associated with the point of failure of the first decoded output; modifying at least one of the first symbol and the second symbol to yield a first modification; modifying the first decoded output to incorporate the first modification to yield a first modified decode output; applying the data decode algorithm to the decoder input guided by the first modified decode output to yield a second decoded output; identifying at least a third symbol and a fourth symbol associated with the point of failure of the second decoded output; modifying at least one of the third symbol and the fourth symbol to yield a second modification; and modifying the second decoded output to incorporate the first modification and the second modification to yield a second modified decode output. In some cases, the methods further include applying the data decode algorithm to the decoder input guided by the first modified decode output to yield a third decoded output.

In various instances, modifying at least one of the first symbol and the second symbol to yield the first modification includes: calculating a syndrome including the first symbol and the second symbol; calculating an array of possible hard decision values across the contributors to the point of failure of the first decoded output; determining an index corresponding to a candidate from the array as an identified symbol; determining a subset values associated with the identified symbol to be modified; modifying the subset of values to yield a modified decoded output; and applying the data decode algorithm by the data decoder circuit to the decoder input guided by the modified decoded output to yield a second decoded output.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for data processing, and more particularly to systems and methods for data decoding.

Various embodiments of the present invention provide data processing systems that include a data decoder circuit having a low complexity decoder circuit and a partial maximum likelihood decode value modification circuit that is selectively used to modify an output of the belief propagation decoder circuit across multiple passes when a potential trapping set is detected. As just one of many advantages, the aforementioned approach allows for using data decoder circuits that exhibit relatively low complexity such as, for example, a belief propagation decoder circuit, while using another decoder algorithm to correct errors that are not correctable by the low complexity decoder algorithm. As the errors to be corrected are localized by the belief propagation decoder circuit, the complexity of the other decoder circuit may be very low.

In some cases, selective modification of an output of the low density parity check decoder circuit is done based upon some conclusions about a subset of uncorrectable errors. In particular, it has been determined that: every unsatisfied checks is connected by one error symbol, the error symbol has the most significant ambiguity among all variable nodes associated with an unsatisfied checks, and the second most likely symbol associated with the error symbol is almost always the correct symbol. Based upon this, some embodiments of the present invention identify uncorrectable errors that seem to correspond to the above criteria, and modify the error symbol to use the second most likely value on a first pass. In some cases, the uncorrectable error condition is referred to as a potential trapping set condition. Subsequent to the modification, the belief propagation decoding is performed anew using the modified symbol to yield another output, and the output generated by the belief propagation decoding are used to determine another set of symbols to be modified on a second pass. Then, the belief propagation decoding is performed on the data set including modified symbols that were identified on both the first pass and the second pass.

Figure 1A:
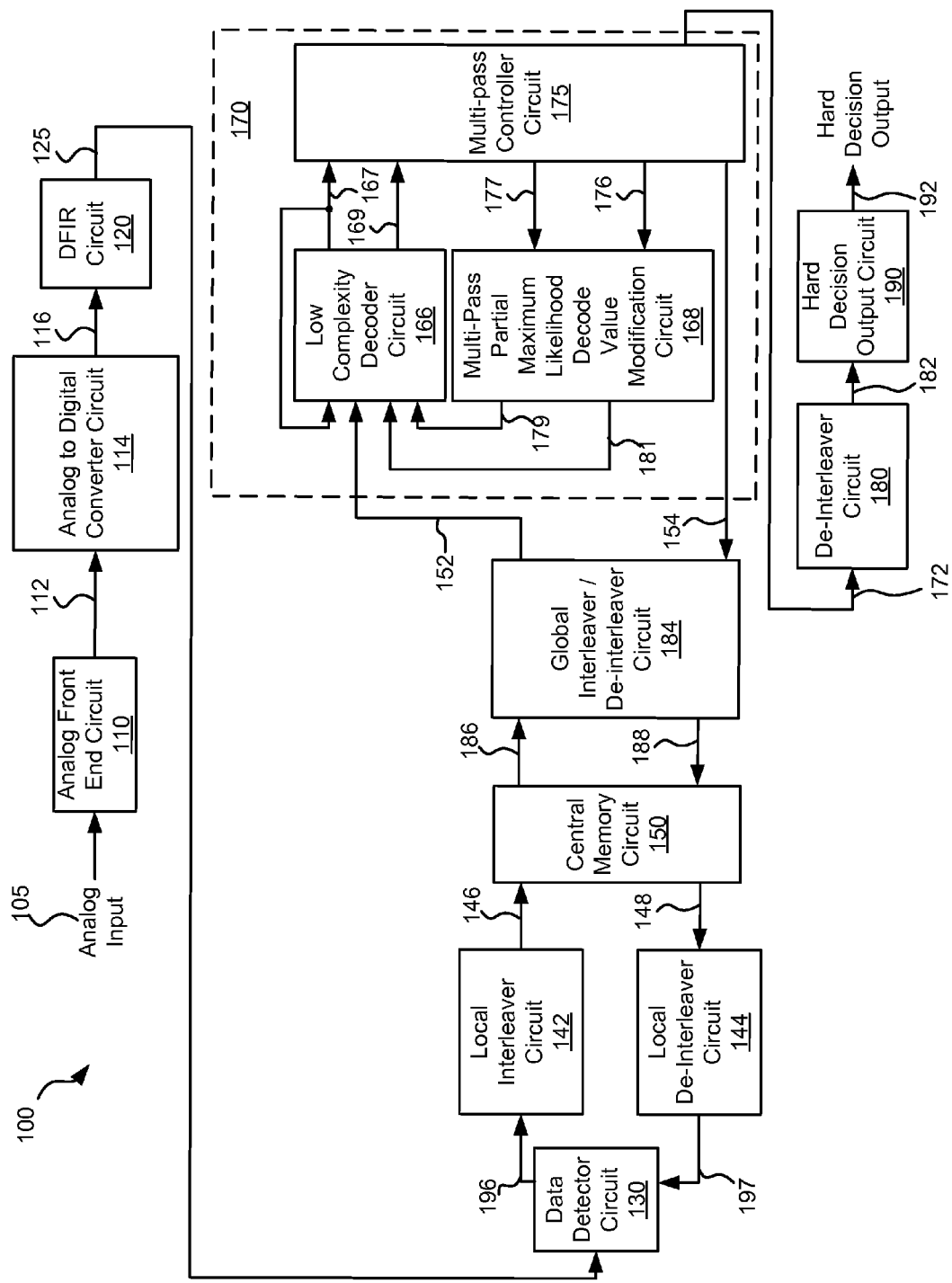
FIG. 1a shows a data processing circuit including a multi-pass alternate decoding circuit in accordance with one or more embodiments of the present invention.

Turning to FIG. 1a, a data processing circuit 100 is shown that includes a data decoding circuit 170 including a combination of a low complexity decoder circuit 166 and a multi-pass partial maximum likelihood decode value modification circuit 168 in accordance with one or more embodiments of the present invention. Low complexity decoder circuit 166 may be any decoder circuit known in the art that is less complex to implement than a maximum likelihood decoder circuit. In some cases, low complexity decoder circuit 166 is a belief propagation decoder circuit as are known in the art. Such a belief propagation data decoder circuit may be implemented similar to that discussed in Pearl, Judea, "REVEREND BAYES ON INFERENCE ENGINES: A DISTRIBUTED HIERARCHAL APPROACH", AAAI-82 Proceedings, 1982. The entirety of the aforementioned reference is incorporated herein by reference for all purposes. Data processing circuit 100 includes an analog front end circuit 110 that receives an analog signal 105. Analog front end circuit 110 processes analog signal 105 and provides a processed analog signal 112 to an analog to digital converter circuit 114. Analog front end circuit 110 may include, but is not limited to, an analog filter and an amplifier circuit as are known in the art. Based upon the disclosure provided herein, one of ordinary skill in the art will recognize a variety of circuitry that may be included as part of analog front end circuit 110. In some cases, analog signal 105 is derived from a read/write head assembly (not shown) that is disposed in relation to a storage medium (not shown). In other cases, analog signal 105 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 105 may be derived.

Analog to digital converter circuit 114 converts processed analog signal 112 into a corresponding series of digital samples 116. Analog to digital converter circuit 114 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 116 are provided to an equalizer circuit 120. Equalizer circuit 120 applies an equalization algorithm to digital samples 116 to yield an equalized output 125. In some embodiments of the present invention, equalizer circuit 120 is a digital finite impulse response filter circuit as are known in the art. In some cases, equalizer 120 includes sufficient memory to maintain one or more codewords until a data detector circuit 130 is available for processing, and for multiple processes through data detector circuit 130.

Data detector circuit 130 is operable to apply a data detection algorithm to a received codeword or data set, and in some cases data detector circuit 130 can process two or more codewords in parallel. In some embodiments of the present invention, data detector circuit 130 is a Viterbi algorithm data detector circuit as are known in the art. In other embodiments of the present invention, data detector circuit 130 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Data detector circuit 130 is started based upon availability of a data set from equalizer circuit 120 or from a central memory circuit 150.

Upon completion, data detector circuit 130 provides a detector output 196. Detector output 196 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 196 is provided to a local interleaver circuit 142. Local interleaver circuit 142 is operable to shuffle sub-portions (i.e., local chunks) of the data set included as detected output and provides an interleaved codeword 146 that is stored to central memory circuit 150. Interleaver circuit 142 may be any circuit known in the art that is capable of shuffling data sets to yield a re-arranged data set. Interleaved codeword 146 is stored to central memory circuit 150. Interleaved codeword 146 is comprised of a number of encoded sub-codewords designed to reduce the complexity of a downstream data decoder circuit while maintaining reasonable processing ability.

Once a data decoding circuit 170 is available, a previously stored interleaved codeword 146 is accessed from central memory circuit 150 as a stored codeword 186 and globally interleaved by a global interleaver/de-interleaver circuit 184. Global interleaver/De-interleaver circuit 184 may be any circuit known in the art that is capable of globally rearranging codewords. Global interleaver/De-interleaver circuit 184 provides a decoder input 152 as an input to low data decoding circuit 170.

Data decoding circuit 170 includes low complexity decoder circuit 166, multi-pass partial maximum likelihood decode value modification circuit 168, and a multi-pass controller circuit 175. Low complexity decoder circuit 166 receives decoder input 152 and applies a decoder algorithm thereto to yield a decoder output 167. In addition, checksum indices 169 (i.e., an identification of a particular parity check equation) of any unsatisfied parity checks are generated. Decoder output 167 and checksum indices 169 are provided to multi-pass controller circuit 175. In addition, decoder output 167 is fed back to low complexity decoder circuit 166 where it can be used to guide subsequent application of the decoder algorithm to decoder input 152.

Multi-pass controller circuit 175 utilizes decoder output 167 and checksum indices 169 to determine if a potential trapping set condition has occurred. Where a potential trapping set condition has occurred, a log likelihood ratio (LLR) subset output 177 (a portion of decoder output 167) and corresponding index outputs 176 (i.e., a portion of checksum indices 169 corresponding to LLR subset output 177) are provided by multi-pass controller circuit 175 to multi-pass partial maximum likelihood decode value modification circuit 168. Multi-pass partial maximum likelihood decode value modification circuit 168 determines which symbols are associated with an unsatisfied check. Each unsatisfied check is indicated by index outputs 176. A total syndrome (s) is calculated for each of the unsatisfied checks in accordance with the following equation:

$$s = \sum_{i=0}^{M} v_i \times e_i,$$

where $v_i$ corresponds to hard decision values of the variable nodes feeding a check node associated with the unsatisfied check, M is the number of variable nodes corresponding to the check node, and $e_i$ corresponds to the edge values connecting the variable nodes to the check node. FIG. 1$b$ shows a portion of a decoder algorithm graph 131 showing M variable nodes ($v_i$) 132 connected to a check node 133 where the checksum is unsatisfied via a M edges 134 that each have an edge value.

Multi-pass partial maximum likelihood decode value modification circuit 168 calculates an array of possible hard decision values across the contributors to the unsatisfied check in accordance with the following equation:

$$HD_{i,j}' = (j \times e_i^{-1}) - HD_i, \text{ for } i \in \{1, 2, \ldots M\}, j \in \{1, 2, 3\},$$

where j represents the contribution from the previously calculated total syndrome, $HD_i$ represents the most likely hard decision for the particular instance i, and $e_i^{-1}$ corresponds to the inverse edge value for the particular instance i. In this case, j is a value of 1 to 3 as the decoder is a non-binary decoder using two bit symbols with three non-zero LLR values for each symbol. Where a binary decoder is being used, $j \in \{1\}$. Where three bit symbols are used, $j \in \{1, 2, 3, 4, 5, 6, 7\}$. Thus, while the rest of this embodiment is discussed in relation to a two-bit symbol situation, one of ordinary skill in the art will recognize a variety of other binary and non-binary decoders to which the inventions may be applied.

Using the aforementioned array, multi-pass partial maximum likelihood decode value modification circuit 168 determines the most likely candidate from the array for modification. The most likely candidate is selected as the instance i in each row of the array (i.e., j∈{1, 2, 3}) that has the lowest LLR value. This determination may be done in accordance with the following equation:

$$i_j^* = \arg\min_i(LLR_{HD_i XOR\ HD'_{i,j}}), \text{ for } j \in \{1,2,3\}.$$

This determination results in three index values $i_1, i_2, i_3$ where j∈{1, 2, 3}. Again, where a different number of bits per symbol are being used, the number of index values will be correspondingly different.

The LLR values associated with the index value $i_j^*$ are used by multi-pass partial maximum likelihood decode value modification circuit 168 to determine whether one or two LLR values are to be modified. In particular, multi-pass partial maximum likelihood decode value modification circuit 168 determines whether modifying one LLR value associated with the symbol indicated by index value $i_j^*$ results in a greater change than modifying two LLR values associated with the symbol indicated by index value $i_j^*$. The determination may be made based upon the following comparison:

$$LLR_{HD_i XORHD'_{i,s}} \geq \sum_{j=0}^{3} LLR_{HD_i XORHD'_{i,j}} - LLR_{HD_i XORHD'_{i,s}}$$

Where the comparison indicates that modifying a single LLR value yields a greater change than modifying two LLR values of the symbol indicated by index value $i_j^*$, the following symbol modification is performed:

$$HD_{i^*_s} = HD_{i^*_j}.$$

Otherwise, where the comparison indicates that modifying a single LLR value does not yield a greater change than modifying two LLR values of the symbol indicated by index value $i_j^*$, the following symbol modifications are:

$$HD_{i^*_j} = HD_{i^*_{j,j}}, \text{ for } j \neq s.$$

The modified symbol (with one or two values modified) are provided as a replacement symbol output 179 to low complexity decoder circuit 166 that inserts the modified symbol into decoder output 167 prior to a subsequent application of the data decoder algorithm to decoder input 152.

In one particular embodiment of the present invention, a potential trapping set condition is considered to have occurred where the number of remaining unsatisfied checks after application of the decoder algorithm to decoder input 152 is less than ten, and the indexes corresponding to the remaining unsatisfied checks have not changed for at least two local iterations (i.e., passes through low complexity decoder circuit 166). In addition, in some cases, multi-pass controller circuit 175 is not enabled to indicate a potential trapping set condition until at least four local iterations of decoder algorithm to decoder input 152 have completed. Based upon the disclosure provided herein, one of ordinary skill in the art will recognize other indicia that may be used to define the occurrence of a potential trapping set condition and/or to trigger operation of multi-pass partial maximum likelihood decode value modification circuit 168.

In addition, multi-pass controller circuit 175 determines whether the data decoding algorithm converged. Where the data decoding algorithm failed to converge and no more local iterations (iterations through low complexity decoder circuit 166), multi-pass controller circuit 175 provides a decoder output 154 (i.e., decoder output 167) back to central memory circuit 150 via global interleaver/de-interleaver circuit 184. Prior to storage of decoded output 154 to central memory circuit 150, decoded output 154 is globally de-interleaved to yield a globally de-interleaved output 188 that is stored to central memory circuit 150. The global de-interleaving reverses the global interleaving earlier applied to stored codeword 186 to yield decoder input 152. Once data detector circuit 130 is available, a previously stored de-interleaved output 188 is accessed from central memory circuit 150 and locally de-interleaved by a de-interleaver circuit 144. De-interleaver circuit 144 re-arranges decoder output 148 to reverse the shuffling originally performed by interleaver circuit 142. A resulting de-interleaved output 197 is provided to data detector circuit 130 where it is used to guide subsequent detection of a corresponding data set receive as equalized output 125.

Alternatively, where the data decoding algorithm converged, multi-pass controller circuit 175 provides an output codeword 172 to a de-interleaver circuit 180. De-interleaver circuit 180 rearranges the data to reverse both the global and local interleaving applied to the data to yield a de-interleaved output 182. De-interleaved output 182 is provided to a hard decision output circuit 190. Hard decision output circuit 190 is operable to re-order data sets that may complete out of order back into their original order. The originally ordered data sets are then provided as a hard decision output 192.

As another alternative, where multi-pass controller circuit 175 determines that a potential trapping set has been found and additional local iterations (iterations through low complexity decoder circuit 166) are allowed, multi-pass controller circuit 175 causes a series of actions. First, multi-pass controller circuit 175 provides log likelihood ratio (LLR) subset output 177 (a portion of decoder output 167) and corresponding index outputs 176 that are used by multi-pass partial maximum likelihood decode value modification circuit 168 to determine the modified symbol (with one or two values modified) and provide it as a replacement symbol output 179 to low complexity decoder circuit 166 that inserts the modified symbol into decoder output 167 prior to a subsequent application of the data decoder algorithm to decoder input 152. Second, the replacement symbol output 179 is saved as a saved replacement symbol output 181. Third, low complexity decoder circuit 166 applies the decode algorithm to the modified symbol set formed by incorporating replacement symbol output 179 into decoder output 167 to yield an updated decoder output 167. Fourth, multi-pass controller circuit 175 provides log likelihood ratio (LLR) subset output 177 (a portion of decoder output 167) and corresponding index outputs 176 that are used by multi-pass partial maximum likelihood decode value modification circuit 168 to determine the modified symbol (with one or two values modified) and provide it as a replacement symbol output 179 to low complexity decoder circuit 166. Fifth, low complexity decoder circuit 166 applies the decode algorithm to the modified symbol set formed by incorporating both the replacement symbol output 179 and saved replacement symbol output 181 into decoder output 167 to yield an updated decoder output 167.

An example of operation of data decoding circuit 170 is provided in the following pseudo-code:

```
perform data decode of decoder input 152 by belief propagation decoder circuit 166;
If (number of unsatisfied checks == 0)
{
    provide decoder output 167 as output codeword 172
}
Else if (number of unsatisfied checks > 0 && number of local iterations == maximum)
{
    provide decoder output 167 as decoded output 154
}
Else if (number of unsatisfied checks > 0 &&
        [number of unsatisfied checks >= M OR
            number of local iterations is < N OR
            indexes 169 change from one local iteration to the next])
{
    provide decoder output 167 as an input to low complexity decoder circuit 166
}
Else if (number of unsatisfied checks > 0 &&
        [number of unsatisfied checks < M AND
            number of local iterations is >= N OR
            indexes 169 do not change from one local iteration to the next])
{
    provide LLR subset output 177 and index output 176 to partial maximum likelihood
        decoder circuit 168 to generate replacement symbol output 179;
    modify decoder output 167 to incorporate replacement symbol output 179;
    store replacement symbol output 179 as saved replacement symbol output 181;
    perform decoding by low complexity decoder circuit 166 on the modified decoder output
        to yield an updated decoder output 167;
    provide LLR subset output 177 and index output 176 to partial maximum likelihood
        decoder circuit 168 to generate replacement symbol output 179;
    modify decoder output 167 to incorporate replacement symbol output 179 and saved
        replacement symbol output 181;
    perform decoding by low complexity decoder circuit 166 on the modified decoder output
        to yield an updated decoder output 167;
}
```

Figure 1B:
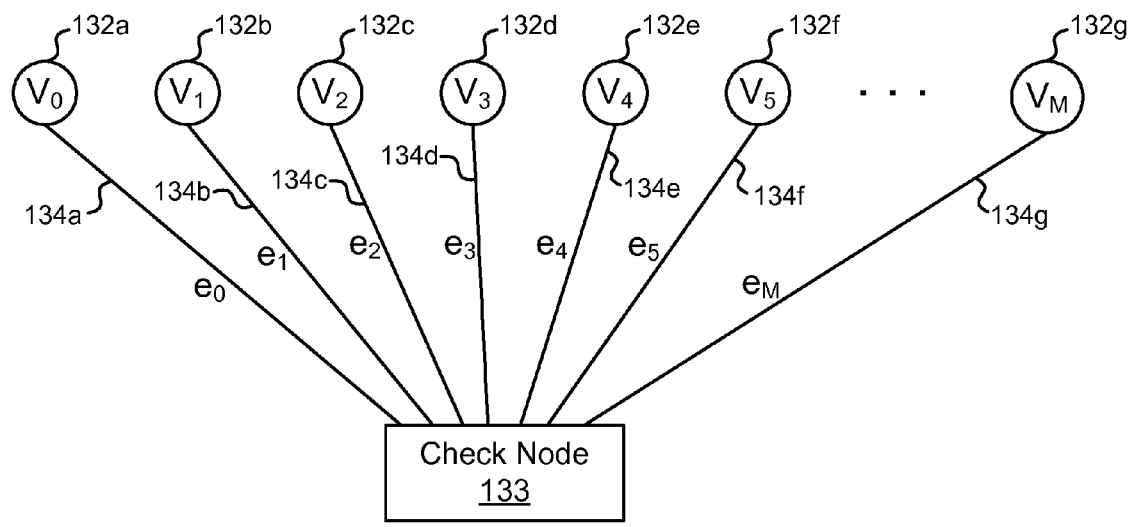
FIG. 1b shows a portion of a decoder algorithm graph having M variable nodes ($v_i$) connected to a check node where the checksum is unsatisfied via a M edges that each have an edge value.
Figure 1C:
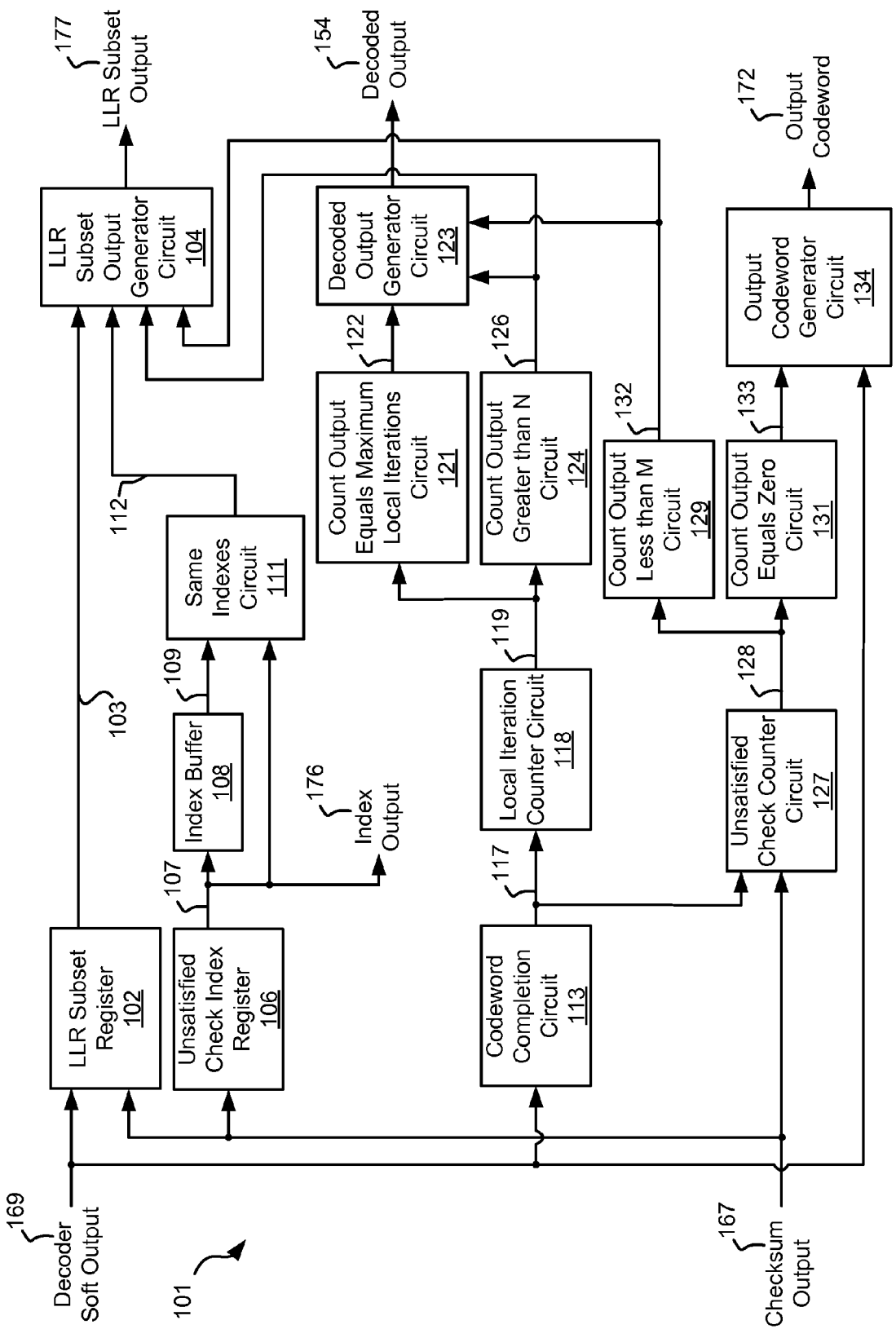
FIG. 1c depicts a multi-pass controller circuit that may be used in relation to the decoder system of FIG. 1a in accordance with various embodiments of the present invention.

Turning to FIG. 1c, a controller circuit 101 that may be used as part of multi-pass controller circuit 175 of FIG. 1 in accordance with various embodiments of the present invention. Controller circuit 101 includes an LLR subset register 102 that stores each element of decoder output 167 that corresponds to a non-zero value of a checksum identified as one of checksum indices 169. An LLR subset register output 103 is provided by LLR subset register 102. In addition, controller circuit 101 includes an unsatisfied check index register 106 that stores each index for which one or more instances of decoder output 167 stored to LLR subset register 102. Controller circuit 101 also includes a codeword completion circuit 113 that counts decoder outputs 167 to determine whether all instances of a codeword have been received. Where a completed codeword is received, a codeword complete output 117 is asserted high.

An unsatisfied check counter circuit 127 counts the number of non-zero parity check equation results (i.e., unsatisfied checks) indicated by checksum indices to yield an unsatisfied check count value 128. Unsatisfied check counter circuit 127 is reset whenever codeword complete output 117 is asserted such that a completed codeword is indicated. Hence, unsatisfied check count value 128 indicates the number of unsatisfied checks that occur for a given codeword. A count output equals zero circuit 131 indicates whether unsatisfied check count value 128 is equal to zero. Where unsatisfied check count value 128 is determined to be equal to zero, count output equals zero circuit 131 asserts a zero count output 133. Where zero count output 133 is asserted indicating that unsatisfied check count value 128 is zero, an output codeword generator circuit 134 provides decoder output 167 as output codeword 172.

In addition, a count output less than M circuit 129 determines whether unsatisfied check count value 128 is greater than zero and less than a value M. In some cases, M is ten. Based upon the disclosure provided herein, one of ordinary skill in the art will recognize other values of M that may be used in relation to different embodiments of the present invention. Where count output less than M circuit 129 determines that the value of unsatisfied check count value 128 is greater than zero and less than M, count output less than M circuit 129 asserts an M count output 132.

A local iteration counter circuit 118 receives codeword complete output 117 and counts the number of local iterations that have been applied to the particular codeword (received as decoder output 167). The number of local iterations is provided as a local iteration count value 119. A count output greater than N circuit receives local iteration count value 119 and asserts a count value greater than N output 126 whenever local iteration count value 119 is greater than N. In some cases, N is three. Based upon the disclosure provided herein, one of ordinary skill in the art will recognize other values of N that may be used in relation to different embodiments of the present invention. A count output equals maximum local iterations circuit 121 receives local iteration count value 119 and asserts a count value equals maximum local iterations output 122 whenever local iteration count value 119 equals the defined maximum number of local iterations. is greater than N. In some cases, N is three. Based upon the disclosure provided herein, one of ordinary skill in the art will recognize other values of N that may be used in relation to different embodiments of the present invention. Where M count output 132 indicates that the number of unsatisfied checks is not zero and count value equals maximum local iterations output 122 indicates the maximum number of local iterations have been performed, a decoded output generator circuit 123 provides a derivative of decoder output 167 as decoded output 154.

An index buffer 108 receives index values 107 from unsatisfied check index register 106 and stores them upon completion of a codeword (e.g., codeword complete output 117 is asserted). Index values 109 from index buffer 108 are compared with index values 107 by a same indexes circuit 111 to determine whether there has been a change over the last two local iterations to determine if the same parity check equations remain unsatisfied. Where the same parity check equations remain unsatisfied, same indexes circuit 111 asserts an unchanged output 112. In addition, index values 107 are provided as an index output 176. LLR subset output generator circuit 104 provides LLR subset register output 103 as LLR subset output 177 whenever same indexes output 112 is asserted, count value greater than N output 126 is asserted, and M count output 132 are all asserted.

Figure 1D:
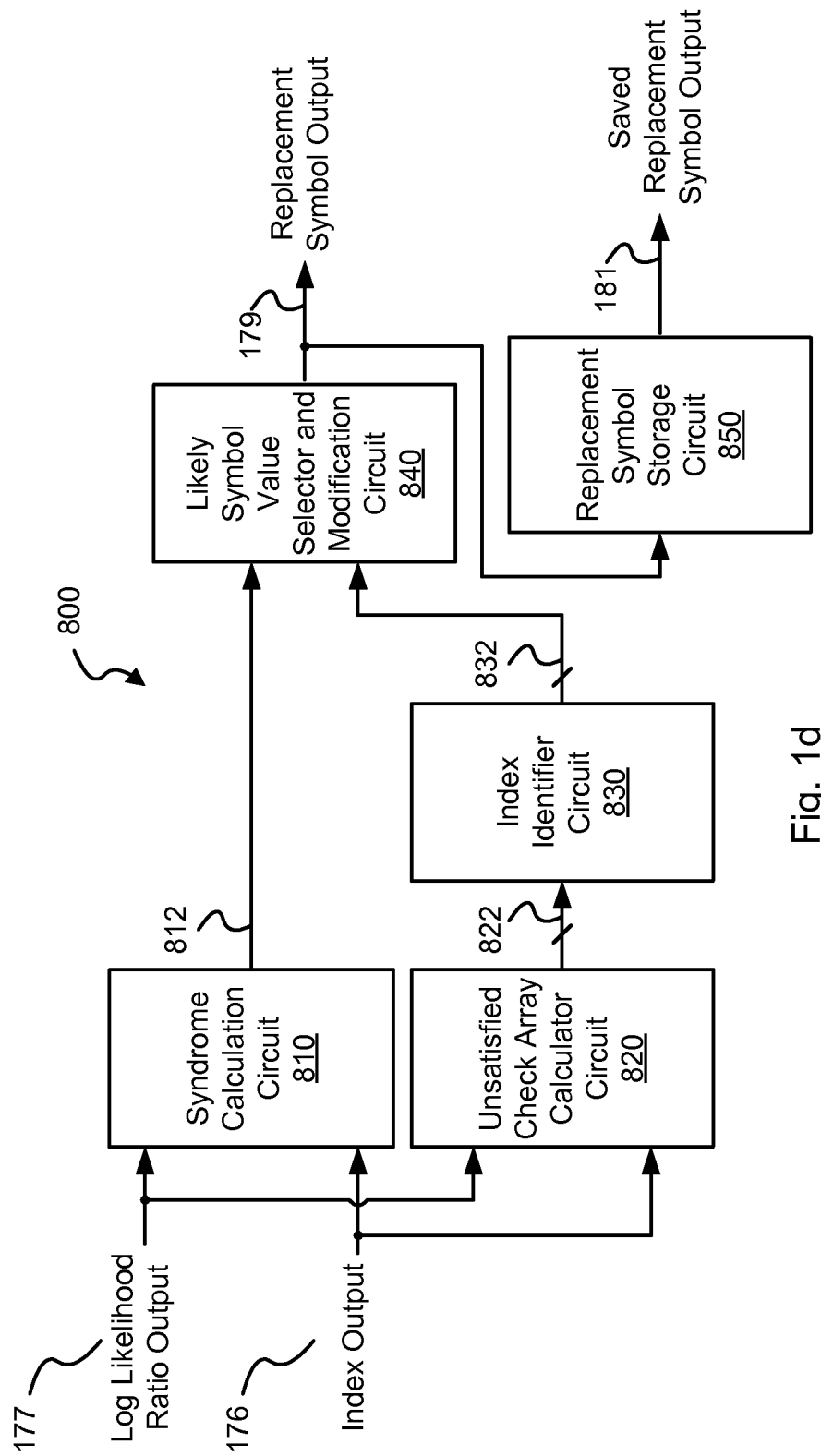
FIG. 1d depicts a simplified maximum likelihood decode value modification circuit that may be used in relation to the decoder system of FIG. 1a in accordance with various embodiments of the present invention.

Turning to FIG. 1d, a simplified maximum likelihood decode value modification circuit 800 is shown that may be used in relation to the decoder system of FIG. 1 in accordance with various embodiments of the present invention. Simplified maximum likelihood decode value modification circuit 800 includes a syndrome calculation circuit 810 that receives log likelihood ratio output 177 and index output 176, and based thereon determines which symbols are associated with a given unsatisfied check, and calculates a total syndrome for each of the unsatisfied checks in accordance with the following equation:

$$s = \sum_{i=0}^{M} v_i \times e_i,$$

where $v_i$ corresponds to hard decision values of the variable nodes feeding a check node associated with the unsatisfied check, M is the number of variable nodes corresponding to the check node, and $e_i$ corresponds to the edge values connecting the variable nodes to the check node. Referring to FIG. 1b, a portion of a decoder algorithm graph 131 showing M variable nodes ($v_i$) 132 connected to a check node 133 where the checksum is unsatisfied via a M edges 134 that each have an edge value. Syndrome calculation circuit 810 provides a syndrome output 812.

In addition, simplified maximum likelihood decode value modification circuit 800 includes an unsatisfied check array calculator circuit 820 that receives log likelihood ratio output 177 and index output 176, and based thereon determines which symbols are associated with a given unsatisfied check and calculates an calculates an array of possible hard decision values across the contributors to the unsatisfied check in accordance with the following equation:

$$HD_{i,j}' = (j \times e_i^{-1}) - HD_i, \text{ for } i \in \{1,2,\ldots M\}, j \in \{1,2,3\},$$

where j represents the contribution from the previously calculated total syndrome, $HD_i$ represents the most likely hard decision for the particular instance i, and $e_i^{-1}$ corresponds to the inverse edge value for the particular instance i. In this case, j is a value of 1 to 3 as the decoder is a non-binary decoder using two bit symbols with three non-zero LLR values for each symbol. Where a binary decoder is being used, $j \in \{1\}$. Where three bit symbols are used, $j \in \{1, 2, 3, 4, 5, 6, 7\}$. Thus, while the rest of this embodiment is discussed in relation to a two-bit symbol situation, one of ordinary skill in the art will recognize a variety of other binary and non-binary decoders to which the inventions may be applied. Unsatisfied check array calculator circuit 820 provides the calculated array as a vector output 822 to an index identifier circuit 832.

Index identifier circuit 830 uses vector output 822 representing the array of possible hard decision values to determine the most likely candidate from the array for modification. The most likely candidate is selected as the instance i in each row of the array (i.e., $j \in \{1, 2, 3\}$) that has the lowest LLR value. This determination may be done in accordance with the following equation:

$$i_j^* = \arg\min_i (LLR_{HD_i \text{XOR } HD'_{i,j}}), \text{ for } j \in \{1,2,3\}.$$

This determination results in three index values $i_1, i_2, i_3$ where $j \in \{1, 2, 3\}$. Again, where a different number of bits per symbol are being used, the number of index values will be correspondingly different. This identified set of index values is provided as an index output 832 to a likely symbol value selector and modification circuit 830.

Likely symbol value selector and modification circuit 830 uses the LLR values indicated by index output to determine whether one or two LLR values are to be modified. In particular, likely symbol value selector and modification circuit 830 determines whether modifying one LLR value associated with the symbol indicated by index value $i_j^*$ results in a greater change than modifying two LLR values associated with the symbol indicated by index value $i_j^*$. The determination may be made based upon the following comparison:

$$LLR_{HD_i \text{XORHD}'_{i,s}} \geq \sum_{j=1}^{3} LLR_{HD_i \text{XORHD}'_{i,j}} - LLR_{HD_i \text{XORHD}'_{i,s}}$$

Where the comparison indicates that modifying a single LLR value yields a greater change than modifying two LLR values of the symbol indicated by index value $i_j^*$, the following symbol modification is performed:

$$HD_{i*s} = HD_{i*j'}$$

Otherwise, where the comparison indicates that modifying a single LLR value does not yield a greater change than modifying two LLR values of the symbol indicated by index value $i_j^*$, the following symbol modifications are:

$$HD_{i*j} = HD_{i*j,j}, \text{ for } j \neq s.$$

The modified symbol (with one or two values modified) are provided as a replacement symbol output 179. In addition, replacement symbol output 179 is stored to a replacement symbol storage circuit 850. Replacement symbol storage circuit 850 provides the stored data as a saved replacement symbol output 181.

Figure 2A:
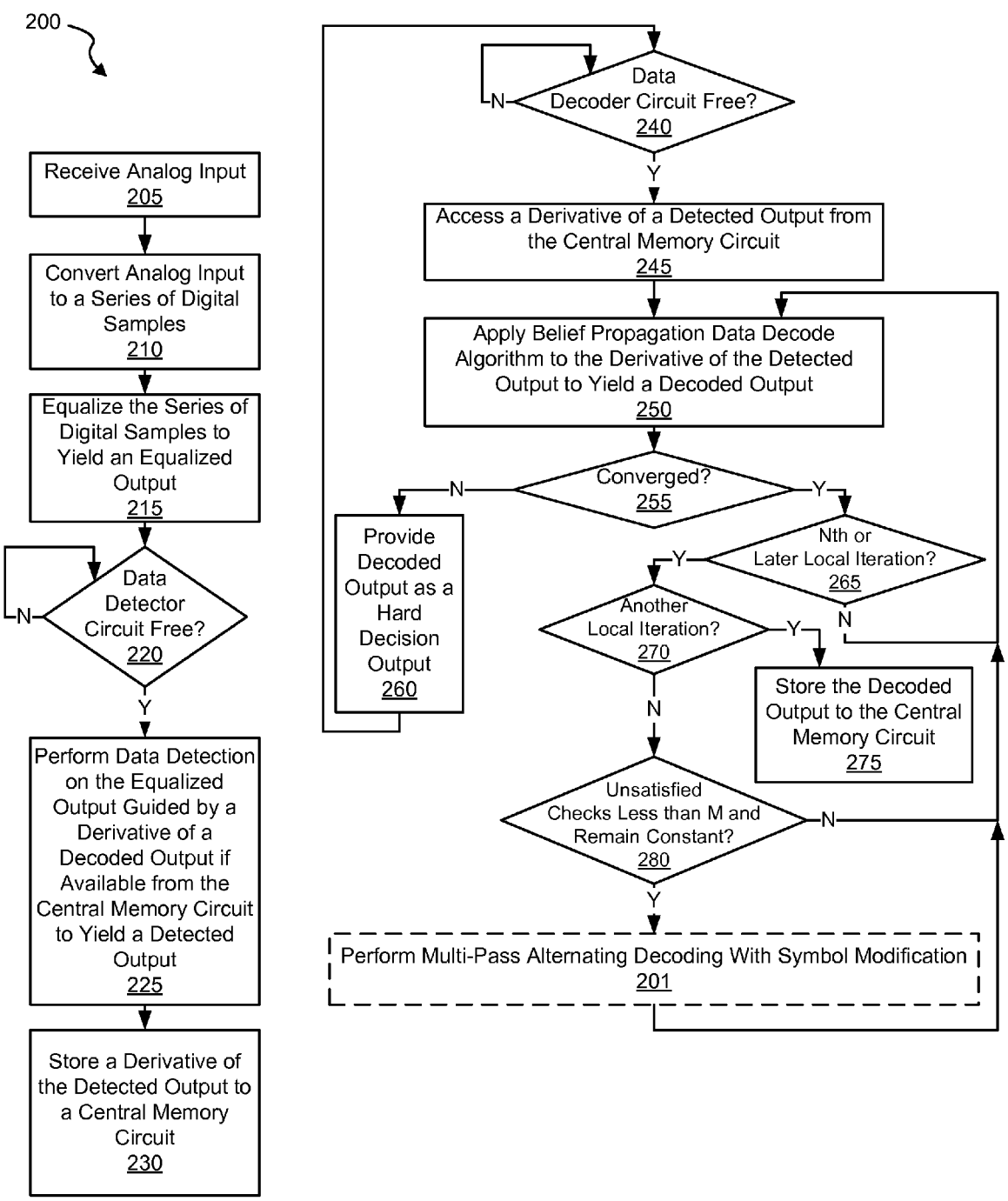
FIG. 2a is a flow diagram showing method for multi-pass alternate decoding in accordance with various embodiments of the present invention.

Turning to FIG. 2a, a flow diagram 200 shows a method for multi-pass alternate decoding in accordance with various embodiments of the present invention. Following flow diagram 200, an analog input is received (block 205). The analog input may be derived from, for example, a storage medium or a data transmission channel. Based upon the disclosure provided herein, one of ordinary skill in the art will recognize a variety of sources of the analog input. The analog input is converted to a series of digital samples (block 210). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 215). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention.

It is determined whether a data detector circuit is available (block 220). Where a data detector circuit is available (block 220), a data detection algorithm is applied to the equalized output guided by a data set derived from a decoded output where available (e.g., the second and later iterations through the data detector circuit and the data decoder circuit) from a central memory circuit to yield a detected output (block 225). In some embodiments of the present invention, data detection algorithm is a Viterbi algorithm as are known in the art. In other embodiments of the present invention, the data detection algorithm is a maximum a posteriori data detection algorithm as are known in the art. The data set derived from the decoded output may be a de-interleaved version of the decoded data set. A signal derived from the detected output (e.g., a locally interleaved version of the detected output) is stored to the central memory to await processing by a data decoder circuit (block 230).

In parallel to the previously discussed data detection processing, it is determined whether a data decoder circuit is available (block 240). Where the data decoder circuit is available (block 240), a previously stored derivative of a detected output is accessed from the central memory (block 245). A low complexity data decode algorithm is applied to the derivative of the detected output to yield a decoded output (block 250). In some embodiments of the present invention, the low complexity data decode algorithm is a belief propagation data decode algorithm as are known in the art. Such a belief propagation data decode algorithm may be implemented similar to that discussed in Pearl, Judea, "REVEREND BAYES ON INFERENCE ENGINES: A DISTRIBUTED HIERARCHAL APPROACH", AAAI-82 Proceedings, 1982. It should be noted that other embodiments of the present may use different decode algorithms.

It is determined whether the decoded output converged (i.e., the original data set is recovered) (block 255). In some cases, such convergence is found where all of the checksum equations utilized as part of the low complexity decode algorithm are correct (i.e., there are no unsatisfied checks). Where the decode algorithm converged (block 255), the decoded output is provided as a hard decision output (block 260). Otherwise, where the decode algorithm failed to converge (block 255), it is determined whether the number of local iterations of the data decode algorithm on the current data set exceeded a threshold value N (block 265). In some cases, N is four. Based upon the disclosure provided herein, one of ordinary skill in the art will recognize other values of N that may be used in relation to different embodiments of the present invention. Where the number of local iterations has not exceeded the threshold value N (block 265), the processes of blocks 250-265 are repeated for the same data set using the previous decoded output as a guide.

Otherwise, where the number of local iterations has exceeded the threshold value N (block 265), it is determined whether another local iteration is to be performed (block 270). In some cases, this is determined by comparing the number of local iterations that have been completed to a defined threshold number. Where another local iteration is not called for (e.g., the number of local iterations equals a maximum number of local iterations) (block 270), the decoded output is stored to the central memory circuit where it awaits processing by the data detector circuit (i.e., another global iteration) (block 275). Otherwise, where it is determined that another local iteration is called for (e.g., the number of local iterations is not equal to a maximum number of local iterations) (block 270), it is determined whether the number of remaining unsatisfied checks is less than a threshold value M (block 280). In some cases, M is ten. Based upon the disclosure provided herein, one of ordinary skill in the art will recognize other values of M that may be used in relation to different embodiments of the present invention. Where the number of unsatisfied checks is not less than the threshold value M (block 280), the processes of blocks 250-280 are repeated for the same data set using the previous decoded output as a guide.

Otherwise, where the number of unsatisfied checks is less than the threshold value M (block 280), a multi-pass alternating decoding with symbol modification is performed (block 201). Multi-pass alternating decoding with symbol modification includes performing a partial maximum likelihood decode process on a subset of the decoded output (i.e., portions of the decoded output corresponding to unsatisfied checks). The partial maximum likelihood decode process identifies one or more likely symbol errors. These likely symbol errors are saved as saved symbol errors for use in a subsequent pass. The decoded output is modified to change the values of the likely symbol errors, and the belief propagation algorithm is re-applied to the derivative of the detected output guided by the modified decoded output to yield an updated decoded output. The partial maximum likelihood decode process is applied to a subset of the updated decoded output (i.e., portions of the decoded output corresponding to unsatisfied checks). Again, the partial maximum likelihood decode process identifies one or more likely symbol errors. These likely symbol errors and the previously saved likely symbol errors are used to guide bit modification in the updated decoded output. Subsequently, the belief propagation algorithm is re-applied to the derivative of the detected output guided by the newly formed modified decoded output to yield an updated decoded output. The updated decoded output is then used to guide re-application of the low density parity check decoding algorithm to the derivative of the detected output (block 250), and the processes of blocks 255-292 are repeated.

Figure 2B:
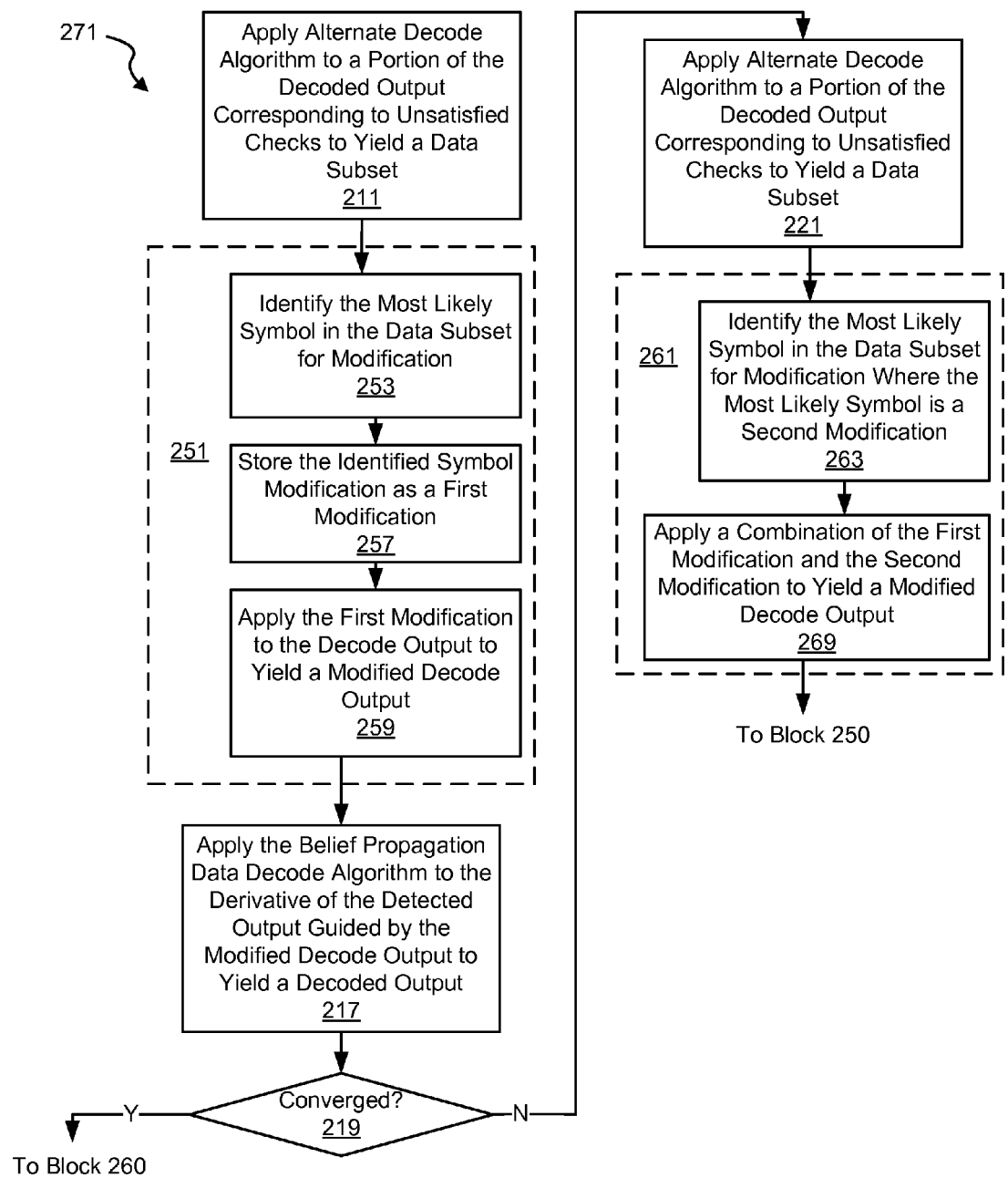
FIG. 2b is a flow diagram showing an implementation of the multi-pass alternate decoding of FIG. 2a in accordance with some embodiments of the present invention.

Turning to FIG. 2b, a flow diagram 271 shows an implementation of the multi-pass alternate decoding with symbol modification of FIG. 2a in accordance with some embodiments of the present invention. Following flow diagram 271, an alternate decode algorithm is applied to a portion of the decoded output corresponding to unsatisfied checks to yield a data subset (block 211). A symbol modification is then performed (block 251) based upon the data subset. The symbol modification (block 251) includes identifying the most likely symbol corresponding to each unsatisfied check for modification (block 253). The identified symbol is stored as a first modification (block 257). The first modification is then applied to the decoder output to yield a modified decode output (block 259). Application of the first modification to yield the modified decode output includes modifying the bits of the overall decode output in accordance with the first modification. Thus, the modified decode output is the original decode output (from block 250) having one or more symbols modified in accordance with the first modification.

Next, apply the belief propagation data decode algorithm to the derivative of the detected output guided by the modified decode output to yield a decoded output (block 217). This is the same process as block 250. It is determined whether the decoded output converged (i.e., the original data set is recovered) (block 219). Where the decoded output converged (block 219), the decoded output is provided to block 260 of FIG. 2a. Alternatively, where the decoded output failed to converge (block 219), the alternate decode algorithm is applied to a portion of the decoded output from block 217 corresponding to unsatisfied checks to yield a data subset (block 221). A symbol modification is then performed (block 261) based upon the data subset. The symbol modification (block 261) includes identifying the most likely symbol corresponding to each unsatisfied check for modification which is a second modification (block 263). A combination of the first modification and the second modification is then applied to the decoder output to yield a modified decode output (block 269). Application of the combination of the first modification and the second modification to yield the modified decode output includes modifying the bits of the overall decode output in accordance with the combination of the first modification and the second modification. Thus, the modified decode output is the original decode output (from block 217) having one or more symbols modified in accordance with the combination of the first modification and the second modification. The modified decode output is then provided to block 250 of FIG. 2a.

Figure 2C:
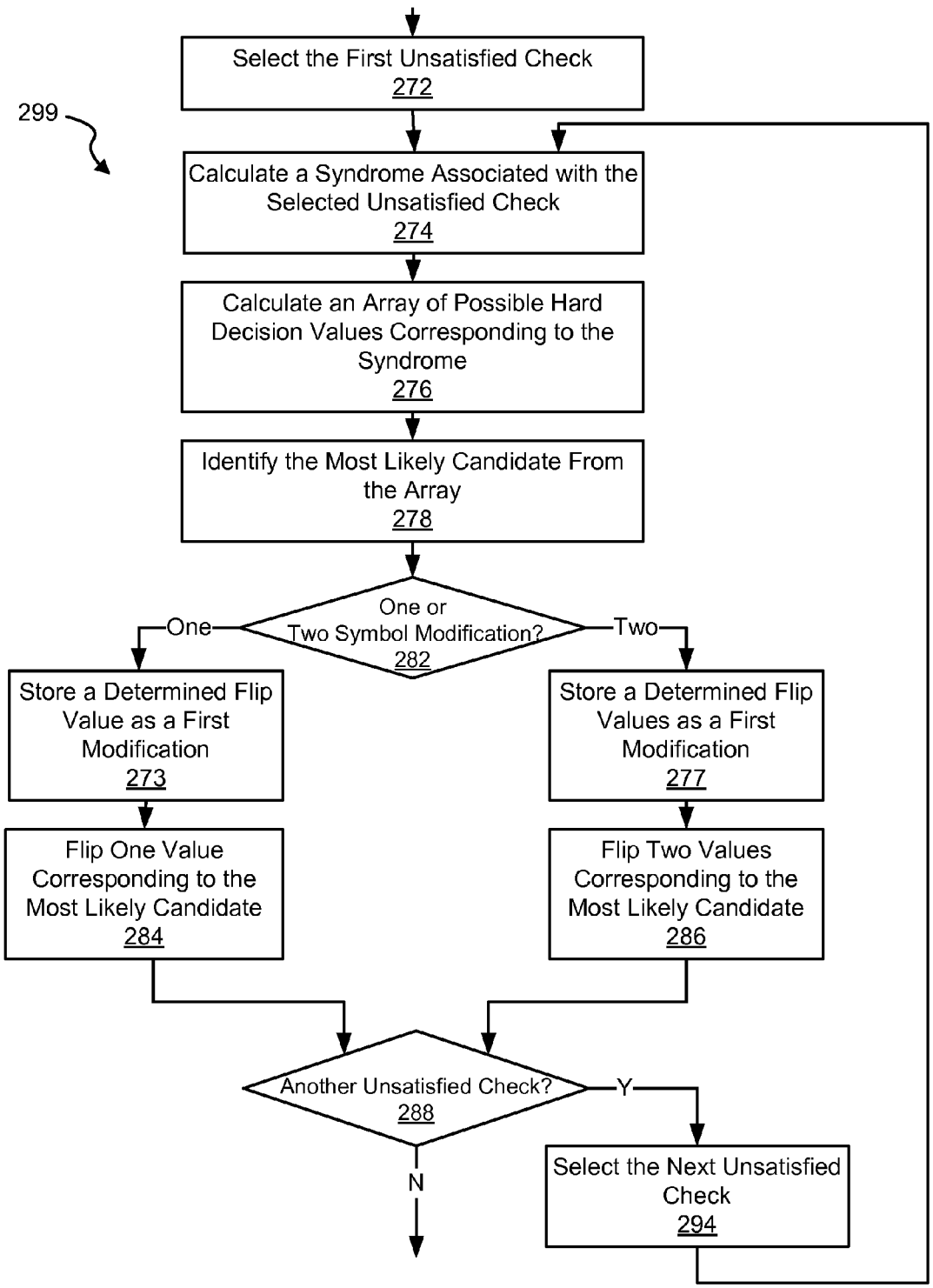
FIG. 2c is a flow diagram showing a method for utilizing the method of FIG. 2b in relation to symbol modification in accordance with some embodiments of the present invention.

Turning to FIG. 2c, a flow diagram 299 shows a method for performing the function of block 251 of FIG. 2b in relation to symbol modification in accordance with some embodiments of the present invention. In this example, each symbol is two bits representing four potential symbol values (i.e., '00', '01', '10', '11'). Following flow diagram 299, a first unsatisfied check is selected (block 272). In some cases, such an unsatisfied check is a parity check equation that did not yield a zero output after application of the data decode algorithm. Each unsatisfied check has a number of symbol values from which the unsatisfied check is calculated. A syndrome for all of the values associated with the selected unsatisfied check is calculated (block 274). In some cases, the syndrome is calculated in accordance with the following equation:

$$s = \sum_{i=0}^{M} v_i \times e_i,$$

where $v_i$ corresponds to hard decision values of the variable nodes feeding a check node associated with the unsatisfied check, M is the number of variable nodes corresponding to the check node, and $e_i$ corresponds to the edge values connecting the variable nodes to the check node. Referring to FIG. 1b, a portion of a decoder algorithm graph 131 showing M variable nodes ($v_i$) 132 connected to a check node 133 where the checksum is unsatisfied via a M edges 134 that each have an edge value.

An array of possible hard decision values are calculated (block 276) across the contributors to the unsatisfied check in accordance with the following equation:

$$HD_{i,j}' = (j \times e_i^{-1}) - HD_i, \text{ for } i \in \{1,2,\ldots M\}, j \in \{1,2,3\},$$

where j represents the contribution from the previously calculated total syndrome, $HD_i$ represents the most likely hard decision for the particular instance i, and $e_i^{-1}$ corresponds to the inverse edge value for the particular instance i. In this case, j is a value of 1 to 3 as the decoder is a non-binary decoder using two bit symbols with three non-zero LLR values for each symbol. Where a binary decoder is being used, $j \in \{1\}$. Where three bit symbols are used, $j \in \{1,2,3,4,5,6,7\}$. Thus, while the rest of this embodiment is discussed in relation to a two-bit symbol situation, one of ordinary skill in the art will recognize a variety of other binary and non-binary decoders to which the inventions may be applied.

An index identifying the most likely candidate from the aforementioned array is selected (block 278). The most likely candidate is selected as the instance i in each row of the array (i.e., $j \in \{1, 2, 3\}$) that has the lowest LLR value. The index may be calculated in accordance with the following equation:

$$i_j^* = \arg\min_i (LLR_{HD_i XOR HD'_{i,j}}), \text{ for } j \in \{1,2,3\}.$$

This determination results in three index values $i_1, i_2, i_3$ where $j \in \{1, 2, 3\}$. Again, where a different number of bits per symbol are being used, the number of index values will be correspondingly different.

It is then determined whether one or two LLR values of the symbol identified by the aforementioned index are to be modified (block 282). In particular, it is determined whether modifying one LLR value associated with the symbol indicated by index value $i_j^*$ results in a greater change than modifying two LLR values associated with the symbol indicated by index value $i_j^*$. The determination may be made based upon the following comparison:

$$LLR_{HD_i XORHD'_{i,s}} \geq \sum_{j=1}^{3} LLR_{HD_i XORHD'_{i,j}} - LLR_{HD_i XORHD'_{i,s}}$$

Where the comparison indicates that modifying a single LLR value yields a greater change than modifying two LLR values of the symbol indicated by index value $i_j^*$ (block 282), the determined flip value (i.e., a new value for one LLR value of the identified most likely candidate) is stored as a first modification (block 273), and the LLR value of the symbol identified by the index is modified (block 284). The modification may be made in accordance with the following equation:

$$HD_{i^*_s} = HD_{i^*_j}.$$

Otherwise, where the comparison indicates that modifying a single LLR value does not yield a greater change than modifying two LLR values of the symbol indicated by index value $i_j^*$ (block 282), the determined flip values (i.e., new values for two LLR values of the identified most likely candidate) is stored as the first modification (block 277), then the two LLR values of the symbol identified by the index are modified (block 286). The modification may be made in accordance with the following equation:

$$HD_{i^*_j} = HD_{i^*_{j,j}}, \text{ for } j \neq s.$$

It is then determined whether another unsatisfied check remains (block 288). Where another unsatisfied check remains (block 288), the next unsatisfied check is selected (block 294), and the processes of blocks 272-288 are repeated to further modify the decoded output. Alternatively, where no additional unsatisfied checks remain (block 288), the process is returned to that discussed in relation to FIG. 2b where the modified decoded output is used to guide re-application of the belief propagation decoding algorithm to the derivative of the detected output (block 217).

Figure 2D:
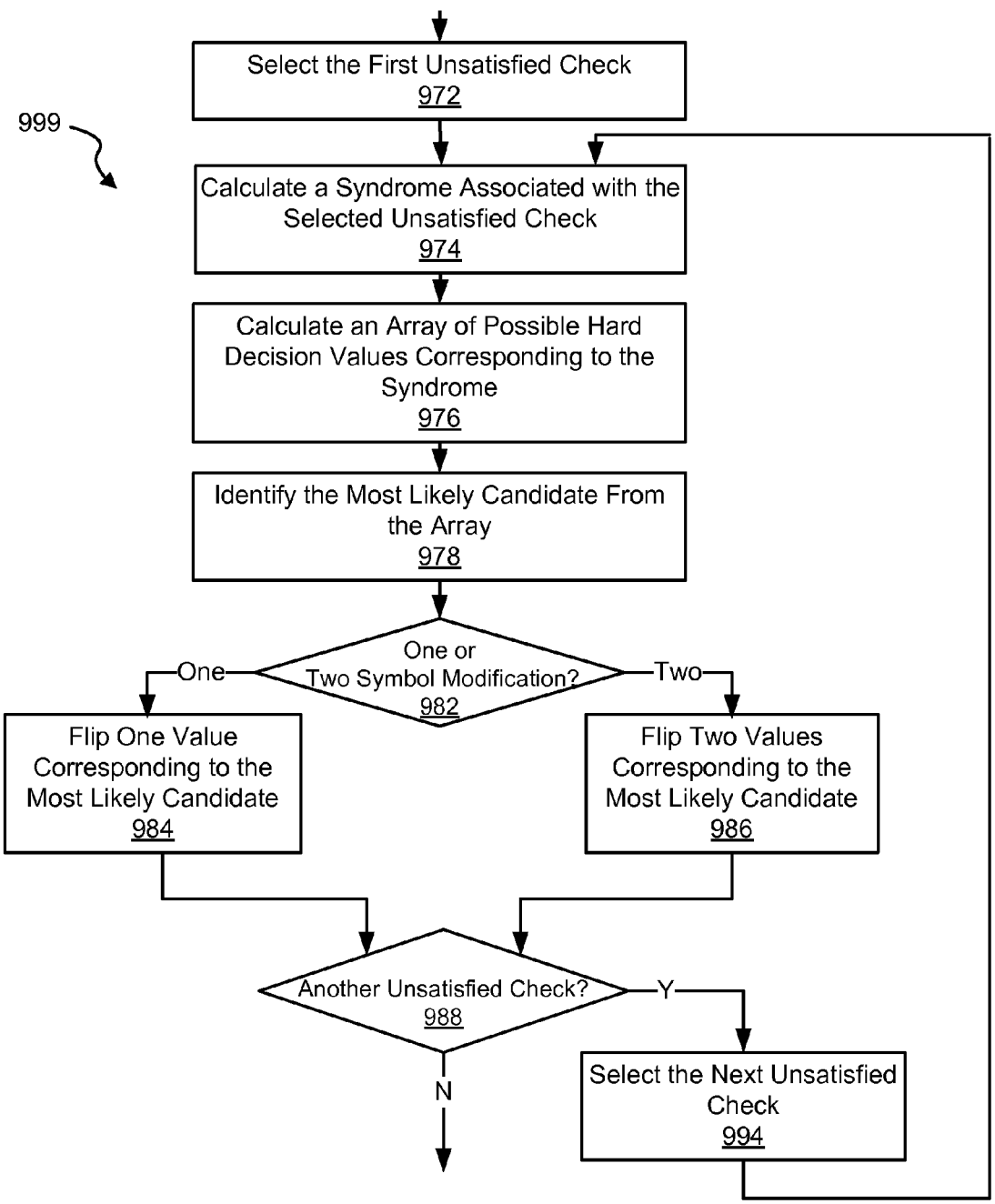
FIG. 2d is a flow diagram showing another method for utilizing the method of FIG. 2b in relation to symbol modification in accordance with some embodiments of the present invention.

Turning to FIG. 2d, a flow diagram 999 shows a method for performing the function of block 261 of FIG. 2b in relation to symbol modification in accordance with various embodiments of the present invention. In this example, each symbol is two bits representing four potential symbol values (i.e., '00', '01', '10', '11'). Following flow diagram 299, a first unsatisfied check is selected (block 972). In some cases, such an unsatisfied check is a parity check equation that did not yield a zero output after application of the data decode algorithm. Each unsatisfied check has a number of symbol values from which the unsatisfied check is calculated. A syndrome for all of the values associated with the selected unsatisfied check is calculated (block 974). In some cases, the syndrome is calculated in accordance with the following equation:

$$s = \sum_{i=0}^{M} v_i \times e_i,$$

where $v_i$ corresponds to hard decision values of the variable nodes feeding a check node associated with the unsatisfied check, M is the number of variable nodes corresponding to the check node, and $e_i$ corresponds to the edge values connecting the variable nodes to the check node. Referring to FIG. 1b, a portion of a decoder algorithm graph 131 showing M variable nodes ($v_i$) 132 connected to a check node 133 where the checksum is unsatisfied via a M edges 134 that each have an edge value.

An array of possible hard decision values are calculated (block 976) across the contributors to the unsatisfied check in accordance with the following equation:

$$HD_{i,j}' = (j \times e_i^{-1}) - HD_i, \text{ for } i \in \{1,2,\ldots M\}, j \in \{1,2,3\},$$

where j represents the contribution from the previously calculated total syndrome, $HD_i$ represents the most likely hard decision for the particular instance i, and $e_i^{-1}$ corresponds to the inverse edge value for the particular instance i. In this case, j is a value of 1 to 3 as the decoder is a non-binary decoder using two bit symbols with three non-zero LLR values for each symbol. Where a binary decoder is being used, $j \in \{1\}$. Where three bit symbols are used, $j \in \{1, 2, 3, 4, 5, 6, 7\}$. Thus, while the rest of this embodiment is discussed in relation to a two-bit symbol situation, one of ordinary skill in the art will recognize a variety of other binary and non-binary decoders to which the inventions may be applied.

An index identifying the most likely candidate from the aforementioned array is selected (block 978). The most likely candidate is selected as the instance i in each row of the array (i.e., $j \in \{1, 2, 3\}$) that has the lowest LLR value. The index may be calculated in accordance with the following equation:

$$i_j^* = \arg\min_i (LLR_{HD_i XOR\, HD'_{i,j}}), \text{ for } j \in \{1,2,3\}.$$

This determination results in three index values $i_1, i_2, i_3$ where $j \in \{1, 2, 3\}$. Again, where a different number of bits per symbol are being used, the number of index values will be correspondingly different.

It is then determined whether one or two LLR values of the symbol identified by the aforementioned index are to be modified (block 982). In particular, it is determined whether modifying one LLR value associated with the symbol indicated by index value $i_j^*$ results in a greater change than modifying two LLR values associated with the symbol indicated by index value $i_j^*$. The determination may be made based upon the following comparison:

$$LLR_{HD_i XORHD'_{i,s}} \geq \sum_{j=1}^{3} LLR_{HD_i XORHD'_{i,j}} - LLR_{HD_i XORHD'_{i,s}}$$

Where the comparison indicates that modifying a single LLR value yields a greater change than modifying two LLR values of the symbol indicated by index value $i_j^*$ (block 982), one LLR value of the symbol identified by the index is modified (block 984). The modification may be made in accordance with the following equation:

$$HD_{i*_s} = HD_{i*_j}.$$

Otherwise, where the comparison indicates that modifying a single LLR value does not yield a greater change than modifying two LLR values of the symbol indicated by index value $i_j^*$ (block 982), two LLR values of the symbol identified by the index are modified (block 986). The modification may be made in accordance with the following equation:

$$HD_{i*_j} = HD_{i*_{j,j}}, \text{ for } j \neq s.$$

It is then determined whether another unsatisfied check remains (block 988). Where another unsatisfied check remains (block 988), the next unsatisfied check is selected (block 994), and the processes of blocks 972-988 are repeated to further modify the decoded output. Alternatively, where no additional unsatisfied checks remain (block 988), the process is returned to that discussed in relation to FIG. 2a where the modified decoded output is used to guide re-application of the low density parity check decoding algorithm to the derivative of the detected output (block 250).

Figure 3:
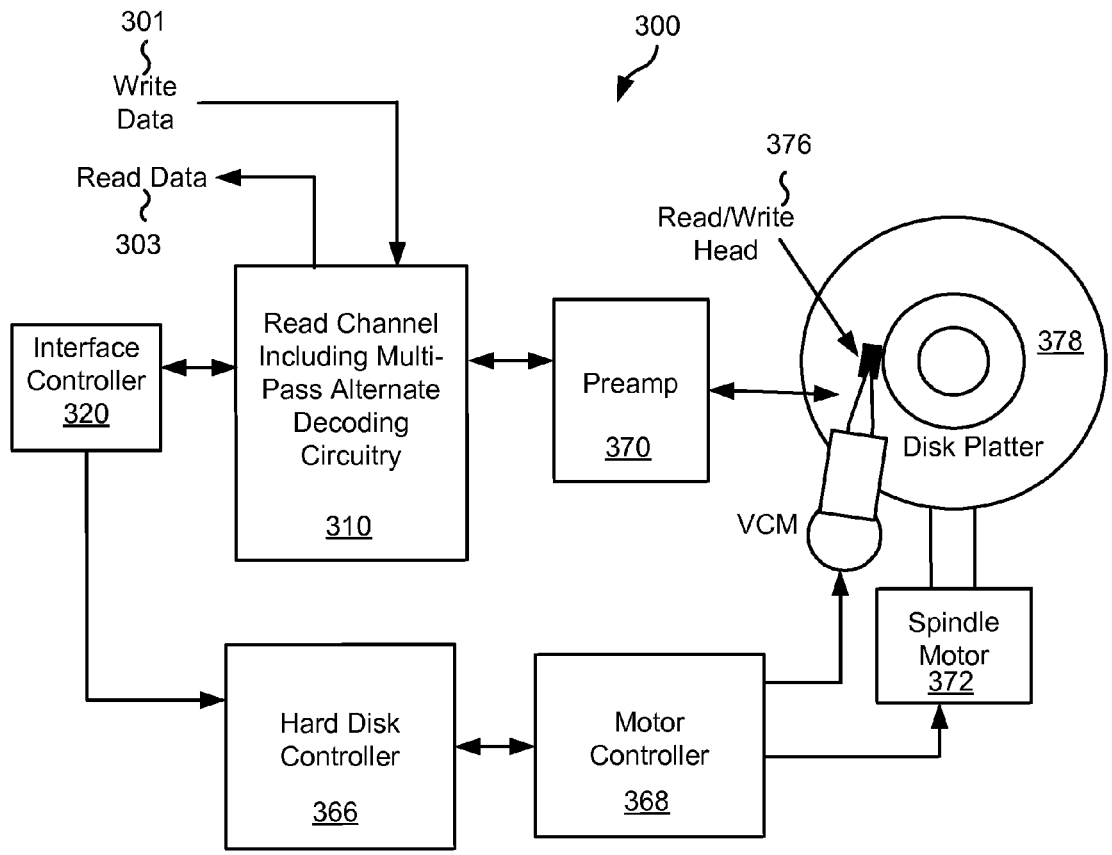
FIG. 3 shows a storage device including multi-pass alternate decoding circuitry in accordance with one or more embodiments of the present invention.

Turning to FIG. 3, a storage device 300 is shown including simplified maximum likelihood value modification circuitry in accordance with one or more embodiments of the present invention. Storage device 300 may be, for example, a hard disk drive. Storage device 300 also includes a preamplifier 370, an interface controller 320, a hard disk controller 366, a motor controller 368, a spindle motor 372, a disk platter 378, and a read/write head assembly 376. Interface controller 320 controls addressing and timing of data to/from disk platter 378. The data on disk platter 378 consists of groups of magnetic signals that may be detected by read/write head assembly 376 when the assembly is properly positioned over disk platter 378. In one embodiment, disk platter 378 includes magnetic signals recorded in accordance with either a longitudinal or a perpendicular recording scheme.

In a typical read operation, read/write head assembly 376 is accurately positioned by motor controller 368 over a desired data track on disk platter 378. Motor controller 368 both positions read/write head assembly 376 in relation to disk platter 378 and drives spindle motor 372 by moving read/write head assembly to the proper data track on disk platter 378 under the direction of hard disk controller 366. Spindle motor 372 spins disk platter 378 at a determined spin rate (RPMs). Once read/write head assembly 378 is positioned adjacent the proper data track, magnetic signals representing data on disk platter 378 are sensed by read/write head assembly 376 as disk platter 378 is rotated by spindle motor 372. The sensed magnetic signals are provided as a continuous, minute analog signal representative of the magnetic data on disk platter 378. This minute analog signal is transferred from read/write head assembly 376 to read channel circuit 310 via preamplifier 370. Preamplifier 370 is operable to amplify the minute analog signals accessed from disk platter 378. In turn, read channel circuit 310 decodes and digitizes the received analog signal to recreate the information originally written to disk platter 378. This data is provided as read data 303 to a receiving circuit. A write operation is substantially the opposite of the preceding read operation with write data 301 being provided to read channel circuit 310. This data is then encoded and written to disk platter 378.

During operation, data decoding applied to the information received from disk platter 378 may not converge. Where it is determined that there is a potential trapping set or other impediment to convergence, a partial maximum likelihood value modification circuit identifies a symbol associated with an unsatisfied check that exhibits the most significant ambiguity. This symbol is then modified and used to replace a corresponding symbol in a previously generated decoded output prior to a subsequent application of a data decode algorithm to a decoder input. The process of modification is then repeated a second time after which all symbols identified in both passes are modified prior to subsequent application of a data decode algorithm. Such symbol modification circuitry may be implemented similar to that discussed above in relation to FIGS. 1a-1d, and/or may be done using a process similar to that discussed above in relation to FIGS. 2a-2d.

It should be noted that storage system may utilize SATA, SAS or other storage technologies known in the art. Also, it should be noted that storage system 300 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 300, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk. It should also be noted that various functions or blocks of storage system 300 may be implemented in either software or firmware, while other functions or blocks are implemented in hardware.

Figure 4:
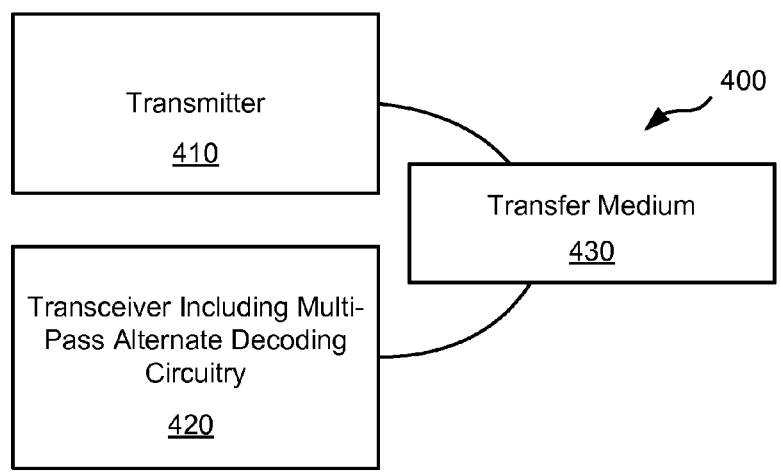
FIG. 4 shows a data transmission system including multi-pass alternate decoding circuitry in accordance with various embodiments of the present invention.

Turning to FIG. 4, a data transmission system 400 including simplified maximum likelihood value modification circuitry in accordance with various embodiments of the present invention. Data transmission system 400 includes a transmitter 410 that is operable to transmit encoded information via a transfer medium 430 as is known in the art. The encoded data is received from transfer medium 430 by receiver 420. Transceiver 420 incorporates data decoder circuitry. While processing received data, received data is converted from an analog signal to a series of corresponding digital samples, and the digital samples are equalized to yield an equalized output. The equalized output is then provided to a data processing circuit including both a data detector circuit and a data decoder circuit. Data is passed between the data decoder and data detector circuit via a central memory allowing for variation between the number of processing iterations that are applied to different data sets. It should be noted that transfer medium 430 may be any transfer medium known in the art including, but not limited to, a wireless medium, an optical medium, or a wired medium. Based upon the disclosure provided herein, one of ordinary skill in the art will recognize a variety of transfer mediums that may be used in relation to different embodiments of the present invention.

During operation, data decoding applied to the information received via transfer medium 430 may not converge. Where it is determined that there is a potential trapping set or other impediment to convergence, a partial maximum likelihood value modification circuit identifies a symbol associated with an unsatisfied check that exhibits the most significant ambiguity. This symbol is then modified and used to replace a corresponding symbol in a previously generated decoded output prior to a subsequent application of a data decode algorithm to a decoder input. The process of modification is then repeated a second time after which all symbols identified in both passes are modified prior to subsequent application of a data decode algorithm. Such symbol modification circuitry may be implemented similar to that discussed above in relation to FIGS. 1a-1d, and/or may be done using a process similar to that discussed above in relation to FIGS. 2a-2d.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data decoding system, the data decoding system comprising:
 a data decoder circuit operable to:
  apply a data decode algorithm to a decoder input to yield a first decoded output and an indication of at least one point of failure of the first decoded output, and
  apply the data decode algorithm to the decoder input guided by a first modified decode output to yield a second decoded output and an indication of at least one point of failure of the second decoded output,
 a decode value modification circuit operable to:
  identify a first symbol of the first decoded output associated with the point of failure of the first decoded output, and to modify a subset of values associated with the identified first symbol to yield the first modified decode output; and
  identify a second symbol of the second decoded output associated with the point of failure of the second decoded output, and to modify a subset of values associated with the identified first symbol and the identified second symbol to yield the second modified decode output.

2. The data decoding system of claim 1, wherein the data decoding system is implemented as part of a device selected from a group consisting of: a storage device, and a receiving device.

3. The data decoding system of claim 1, wherein the data decoding system is implemented as part of an integrated circuit.

4. The data decoding system of claim 1, wherein the data decode algorithm is a low density parity check algorithm, and wherein the point of failure of the first decoded output is a failure of a parity check equation implemented as part of the low density parity check algorithm.

5. The data decoding system of claim 4, wherein the low density parity check algorithm is selected from a group consisting of: a non-binary low density parity check algorithm, and a binary low density parity check algorithm.

6. The data decoding system of claim 4, wherein the low density parity check algorithm is implemented as a belief propagation data decode algorithm.

7. The data decoding system of claim 1, wherein the decode value modification circuit includes a partial maximum likelihood decode algorithm to identify the first symbol and the second symbol.

8. The data decoding system of claim 7, wherein the decode value modification circuit includes:
a syndrome calculation circuit operable to calculate a syndrome based upon a number of symbols associated with the point of failure of the first decoded output;
an array calculator circuit operable to calculate an array of possible hard decision values across the contributors to the point of failure of the first decoded output; and
an index identifier circuit operable to determine a candidate from the array as the identified symbol.

9. The data decoding system of claim 8, wherein the decode value modification circuit includes further comprises:
a likely symbol value selector circuit operable to determine whether the subset of values associated with the identified symbol includes one log likelihood ratio value or two log likelihood ratio values.

10. The data decoding system of claim 1, wherein the data decoder circuit further comprises:
a multi-pass controller circuit operable to selectively control generation of the first modified decode output and the second modified decode output.

11. The data decoding system of claim 10, wherein the multi-pass controller circuit enables generation of the first modified decode output when:
a number of iterations of the data decoder circuit applying the data decode algorithm to the decoder input is greater than a first threshold value;
a number of points of failure corresponding to the first decoded output is less than a second threshold value; and
the number of points of failure corresponding to the first decoded output is the same as the number of points of failure corresponding to a previous decoded output.

12. The data decoding system of claim 1, wherein the data decoder circuit is further operable to apply the data decode algorithm to the decoder input guided by a second modified decode output to yield a third decoded output.

13. The data decoding system of claim 1, wherein the applying the data decode algorithm to the decoder input guided by the second modified decode output further yields an indication of at least one point of failure of the third decoded output.

14. A method for data decoding, the method comprising:
applying a data decode algorithm by a data decoder circuit to a decoder input to yield a first decoded output and an indication of at least one point of failure of the first decoded output;
identifying at least a first symbol and a second symbol associated with the point of failure of the first decoded output;
modifying at least one of the first symbol and the second symbol to yield a first modification;
modifying the first decoded output to incorporate the first modification to yield a first modified decode output;
applying the data decode algorithm to the decoder input guided by the first modified decode output to yield a second decoded output;
identifying at least a third symbol and a fourth symbol associated with the point of failure of the second decoded output;
modifying at least one of the third symbol and the fourth symbol to yield a second modification; and
modifying the second decoded output to incorporate the first modification and the second modification to yield a second modified decode output.

15. The method of claim 14, wherein the method further comprises:
applying the data decode algorithm to the decoder input guided by the first modified decode output to yield a third decoded output.

16. The method of claim 14, wherein modifying at least one of the first symbol and the second symbol to yield the first modification comprises:
calculating a syndrome including the first symbol and the second symbol;
calculating an array of possible hard decision values across the contributors to the point of failure of the first decoded output;
determining an index corresponding to a candidate from the array as an identified symbol;
determining a subset values associated with the identified symbol to be modified;
modifying the subset of values to yield a modified decoded output; and
applying the data decode algorithm by the data decoder circuit to the decoder input guided by the modified decoded output to yield a second decoded output.

17. The method of claim 16, wherein calculating the syndrome is done in accordance with the following equation:

$$s = \sum_{i=0}^{M} v_i \times e_i,$$

wherein $v_i$ corresponds to hard decision values of variable nodes corresponding to the point of failure of a check node, M is the number of variable nodes corresponding to the check node, and $e_i$ corresponds to edge values connecting the variable nodes to the check node.

18. The method of claim 17, wherein calculating the array of possible hard decision values across the contributors to the point of failure is done in accordance with the following equation:

$$\text{Array}_{i,j} = (j \times e_i^{-1}) - HD_i, \text{ for } i \in \{1, 2, \ldots M\}, j \in \{1, 2, 3\},$$

wherein j represents the contribution from the calculated syndrome, $HD_i$ represents the most likely symbol for a particular instance i, and $e_i^{-1}$ corresponds to an inverse edge value for the particular instance i.

19. The method of claim 18, wherein determining the index is done in accordance with the following equation:

$$\text{index}_j = \arg\min_i(LLR_{HD_i XOR\ Array_{i,j}}),$$

wherein, $j \in \{1, 2, 3\}$, and wherein LLR is a log likelihood ratio of the most likely symbol.

20. The method of claim 14, wherein modifying at least one of the third symbol and the fourth symbol to yield the first modification comprises:
calculating a syndrome including the third symbol and the fourth symbol;

calculating an array of possible hard decision values across the contributors to the point of failure of the second decoded output;

determining an index corresponding to a candidate from the array as an identified symbol;

determining a subset values associated with the identified symbol to be modified;

modifying the subset of values to yield a modified decoded output; and applying the data decode algorithm by the data decoder circuit to the decoder input guided by the modified decoded output to yield a second decoded output.

21. A storage device, the storage device comprising:
a storage medium;
a head assembly disposed in relation to the storage medium and operable to provide a sensed signal corresponding to information on the storage medium;
a read channel circuit including:
an analog to digital converter circuit operable to sample an analog signal derived from the sensed signal to yield a series of digital samples;
an equalizer circuit operable to equalize the digital samples to yield a data set;
a data detector circuit operable to apply a data detection algorithm to the data set to yield a detected output; and
a data decoding system including:
a data decoder circuit operable to: apply a data decode algorithm to a decoder input to yield a first decoded output and an indication of at least one point of failure of the first decoded output, apply the data decode algorithm to the decoder input guided by a first modified decode output to yield a second decoded output and an indication of at least one point of failure of the second decoded output, and apply the data decode algorithm to the decoder input guided by a second modified decode output to yield a third decoded output and an indication of at least one point of failure of the third decoded output;
a decode value modification circuit operable to:
identify a first symbol of the first decoded output associated with the point of failure of the first decoded output, and to modify a subset of values associated with the identified first symbol to yield the first modified decode output; and
identify a second symbol of the second decoded output associated with the point of failure of the second decoded output, and to modify a subset of values associated with the identified first symbol and the identified second symbol to yield the second modified decode output.

22. The storage device of claim 21, wherein the decode value modification circuit includes a partial maximum likelihood decode algorithm to identify the first symbol and the second symbol; and wherein the decode value modification circuit includes:
a syndrome calculation circuit operable to calculate a syndrome based upon a number of symbols associated with the point of failure of the first decoded output;
an array calculator circuit operable to calculate an array of possible hard decision values across the contributors to the point of failure of the first decoded output; and
an index identifier circuit operable to determine a candidate from the array as the identified symbol.

* * * * *